(12) United States Patent
Ju et al.

(10) Patent No.: US 6,199,185 B1
(45) Date of Patent: Mar. 6, 2001

(54) TEST METHOD FOR HIGH SPEED SEMICONDUCTOR DEVICES USING A CLOCK MODULATION TECHNIQUE

(75) Inventors: Ki Bong Ju, Cheonan; Jae Bun Ryu, Asan; Il Sik Chi; Heui Han, both of Cheonan, all of (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/062,718

(22) Filed: Apr. 20, 1998

(30) Foreign Application Priority Data

Jun. 30, 1997 (KR) .................................................. 97-29708

(51) Int. Cl.$^7$ .................................................. G01R 31/28
(52) U.S. Cl. ............................................................ 714/744
(58) Field of Search ................................... 714/738, 744, 714/718; 365/201; 713/500

(56) References Cited

U.S. PATENT DOCUMENTS 5,610,864 * 3/1997 Manning ................................. 365/193
5,805,611 * 9/1998 McClure ................................. 714/743
5,933,379 * 8/1999 Park et al. .............................. 365/201

* cited by examiner

Primary Examiner—Albert Decady
Assistant Examiner—Shelly A Chase
(74) Attorney, Agent, or Firm—Jones Volentine, L.L.C.

(57) ABSTRACT

A test method for testing a semiconductor device includes providing a tester which generates a plurality of general clock signals and which has a minimum test cycle time greater than an operational cycle time of the semiconductor device. Then a modulated clock signal is generated from a first general clock signal and a second general clock signal so that the modulated clock signal has a minimum cycle time no greater than the operational cycle time. The next steps include supplying the modulated clock signal to the semiconductor device as a predetermined control signal, supplying test signals to the semiconductor device as specified by a functional test item, and comparing an output of the semiconductor device to a reference value.

13 Claims, 3 Drawing Sheets

TEST METHOD FOR HIGH SPEED SEMICONDUCTOR DEVICES USING A CLOCK MODULATION TECHNIQUE

BACKGROUND OF THE INVENTION

1. Field of the Invention

The present invention relates to speed tests of semiconductor integrated circuit devices. More particularly, the present invention is directed to a method for testing high speed semiconductor memory with a tester having a maximum frequency lower than the operational memory speed by using a clock modulation technique.

2. Description of the Related Arts

A large percentage of conventional Dynamic Random Access Memory (DRAM) devices have been sold with a fast page mode function, and are termed Fast-Page Mode DRAMs. These devices were generally incorporated in x486 and older PENTIUM based microprocessors. A fast page mode operation in a DRAM allows faster data operations within a page boundary defined by a row address. In general, this is accomplished by holding the row address strobe (RAS) signal at an active, low voltage level while toggling the column address strobe (CAS) signals to execute faster memory cycles. Typically, selecting a new row takes about three times longer than selecting another column in the same row. In the CAS signal, a high voltage level is the inactive state and is used to indicate that a change in column address will follow. When the memory is being accessed at two different columns on the same row (i.e., the same page), a mode of operation called the page-page mode, the CAS must remain at the inactive high level for a duration called the CAS precharge time, tcp, for a given memory device to properly recognize that a change of column address is occurring. The minimum CAS precharge time, i.e., minimum $t_{CP}$, is a parameter that varies among different memory devices.

Another enhanced performance option for a DRAM is known as an extended data out (EDO)—sometimes referred to as hyper page mode. A DRAM that includes this feature is termed an EDO DRAM. The EDO DRAM is similar in fashion to the Fast-Page Mode DRAM but operates at an even faster cycle rate. This is accomplished because the CAS signal is not used to also clear the input/output (I/O) buffer of the memory device by setting the high impedance tri-state. This independence allows for pipelined data flow in which data can be read and processed faster. In general, an extended output is accomplished by configuring a DRAM, such as a fast page mode DRAM, so that a separate signal puts the I/O buffer into the high impedance tri-state (indicating no data) when the CAS signal goes into precharge. Thus, in an EDO DRAM, the CAS precharge is not needed to clear the I/O buffer and the CAS precharge time can be considerably shortened. Consequently, data fetch time and operational cycle time can be reduced.

However, the development of these higher speed memory devices requires testers to be faster as well. Since high speed test equipment is very expensive, this requirement can significantly increase the investment in equipment and the total cost of manufacturing these devices. Furthermore, in some cases the evolution of the test equipment does not keep pace with the rapid progress in memory devices, so that a delay in production might be introduced until new, faster test equipment can be made available. Accordingly, there is great benefit in adapting the available low speed test equipment to work with higher speed memory devices in terms of both total production cost and in terms of the time to bring new memory devices to market.

For example, a M9600 tester for memory devices available from MINATO in Japan has a maximum frequency of 33 megahertz, MHz, (i.e., a minimum test cycle time of 30 nanoseconds, ns) and a usable test cycle time that can be adjusted in a range from 30 ns to 4 milliseconds. This tester is not designed to achieve an operational cycle time, i.e., a hyper page cycle time, $t_{HPC}$, of 20 ns to 25 ns needed for a 16M DRAM EDO 50 ns/60 ns page read/write test item.

SUMMARY OF THE INVENTION

It is an object of the present invention to overcome the maximum frequency limitation of a tester and to provide a method to use a low speed tester to test high speed memory devices.

The present invention is a test method for testing a semiconductor device that provides a tester which generates a plurality of general clock signals and which has a minimum test cycle time greater than an operational cycle time of the semiconductor device. Then a modulated clock signal is generated from a first general clock signal and a second general clock signal so that the modulated clock signal has a minimum cycle time no greater than the operational cycle time. The next steps include supplying the modulated clock signal to the semiconductor device as a predetermined control signal, supplying test signals to the semiconductor device as specified by a functional test item, and comparing an output of the semiconductor device to a reference value.

BRIEF DESCRIPTION OF THE DRAWINGS

The preferred embodiments of the present invention are set forth in the detailed description that follows with references to the accompanying drawings in which.

DETAILED DESCRIPTION OF THE PREFERRED EMBODIMENT

The minimum test cycle time of a tester is determined by the maximum frequency of a pulse signal produced by a timing generator in the tester. The present invention provides a method for testing a fast memory device, such as the KM41C16004B 16M EDO DRAM manufactured by SAMSUNG, using a low speed tester, such as one having a maximum frequency of 33 MHz (i.e., a minimum test cycle time of 30 ns).

The functional test items of an EDO DRAM are analogous to fast page mode test items. These test items are the AC parameters including the EDO output data hold time ($t_{DOH}$) parameter, and the EDO mixed test parameters where mixed test refers to mixed input/output operations. The output data hold time, $t_{DOH}$, is the time after the CAS goes to the active low level, with an invalid column address, until data in the I/O buffer are replaced. The EDO mixed test parameters include the hyper-page cycle time ($t_{HPC}$), CAS precharge time ($t_{CP}$), and access time from CAS precharge ($t_{CPA}$), and are tested mainly in page-page mode, i.e., when two different column addresses are accessed in sequence on the same row. The CAS precharge time, $t_{CP}$, as defined above, is the duration of the inactive high level before a change to active low level indicates a new column address for data read or write. The access time from CAS precharge, $t_{CPA}$, is the time required after the CAS signal begins its inactive high level until data is output from or written to the given column address.

For example, specified AC parameters of the KM41C1600B DRAM device are a minimum $t_{HPC}=20$ ns, a minimum $t_{CP}=10$ ns, and a maximum $t_{CPA}=40$ ns. Accordingly, if a single CAS clock signal is used from a tester having a minimum test cycle time of 30 ns, it is impossible to produce a $t_{HPC}$ parameter of 20 ns using the tester as originally designed. In other words, such a tester can not test EDO mode operations of such a DRAM. To overcome this limitation, the present invention modulates two clock signals for producing a $t_{HPC}=20$ ns.

Figure 1:
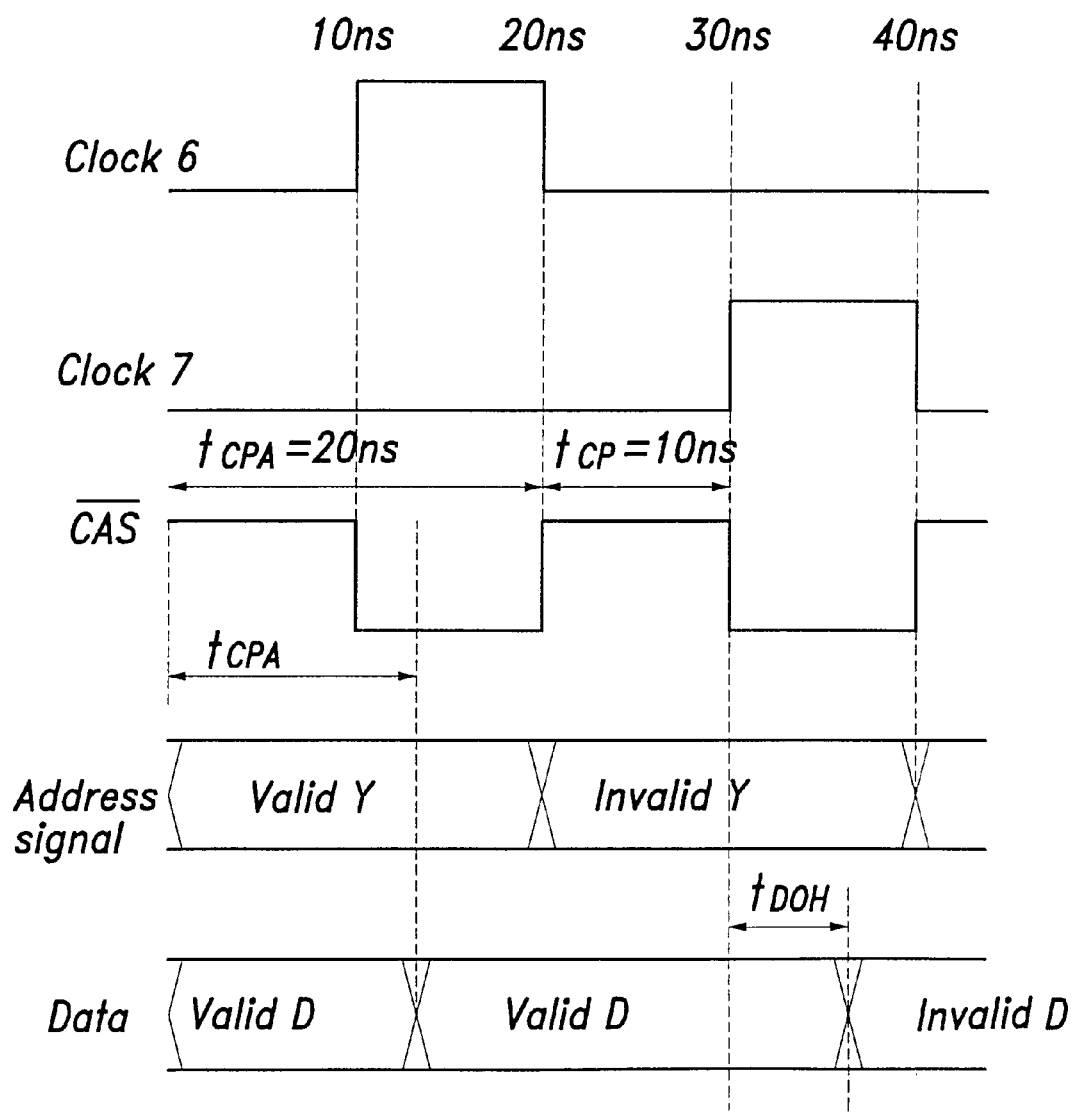
FIG. 1 is a timing diagram for EDO DRAM testing using a modulated clock signal to produce a CAS signal according to the present invention.

FIG. 1 is a timing diagram for EDO DRAM testing using a modulated clock signal according to the present invention to produce a CAS signal. The M9600 tester can produce a total of ten (10) general clock signals. In the usual operation these ten signals are used for the following inputs to a memory device: RAS, CAS, row address indicator, column address indicator, WE (Write Enable), OE (Output Enable), strobe, shift, tri-state signals, and data. The RAS (row address strobe) signal and the CAS (column address strobe) signal are for controlling row address operations and column address operations, respectively, by indicating when an address signal should be utilized. The row address indicator is used to indicate the start of a row address in an address signal, while the column address indicator is used to indicate the start of a column address in that address signal. WE (write enable) and OE (output enable) signals control write/input operations and read/output operations of the memory device, respectively. The strobe signal is used to enable a comparator which compares data output from the memory device with reference values and thus detects memory device failures. The shift signal selectively connects the data I/O buffer of the memory device to either a disk drive or a comparator. The tri-state signal puts the I/O buffer of the memory device in the high impedance tri-state indicating no data.

According to the present invention, a faster CAS signal is produced by modulating two clock signals from the tester. In the preferred embodiment, clock signals 6 and 7, which were originally designed as signals to indicate row address and column address, are used to produce a CAS signal. As shown in FIG. 1, clock 6 has a test cycle time of 40 ns and is at a high level for times between 10 ns and 20 ns, and clock 7 has a test cycle time of 40 ns and is at a high level for times between 30 ns and 40 ns. According to the preferred embodiment, a modulated signal is produced by a NOR combination of the clock 6 and clock 7 signals. As shown in FIG. 1, this modulated signal is used as a CAS signal that satisfies the conditions of $t_{HPC}=20$ ns and $t_{CP}=10$ ns.

Therefore in the page-page read testing of EDO DRAM using this embodiment of the invention, the rate of the tester (i.e., the test cycle time) is set to 40 ns—larger than the 30 ns lower limit of the tester, and two times the needed EDO operational cycle time $t_{HPC}=20$ ns. The clock 6 and clock 7 signals are then combined to produce a modulated signal that has the needed EDO operational cycle time of 20 ns.

According to the present invention, AC parameters such as $t_{HPC}$, $t_{CP}$, $t_{CPA}$, and $t_{DOH}$ are tested with reference to valid data output which are obtained by valid Y address signals. That is, if the memory is not effective at the specified operational cycle time (for example 20 ns in the preferred embodiment), then valid data will not be read and placed into the I/O buffer when the memory is fed this modulated tester signal as the CAS signal. The comparator will detect this failure when the contents of the I/O buffer are compared to the reference values.

Invalid data read operations caused by invalid Y address signals are internally controlled by the DRAM device without the comparator measurement. Although the AC parameter failures can't be detected directly when the column address is invalid, proper operation can be inferred. For example, in the preferred embodiment, a CAS signal with $t_{CP}=10$ ns is produced by the tester, and it is possible to see the effect of this CAS precharge on the next valid data output in the next test cycle. That is, the memory device passes a test satisfying $t_{CP}=10$ ns if two sequential valid data values agree with the reference values when the device is driven by a CAS signal with a cycle time of 20 ns formed by the modulated clock signals.

In a page-page write cycle, $t_{HPC}$ and related EDO AC parameters are obtained by enabling the device write function with a WE clock signal at active low level during a valid Y address. This allows valid data to be delivered into the memory device. The memory write cycle is tested by driving the memory with the modulated CAS signal while the WE signal is active. The contents of memory can then be read out and compared to the reference values to determine whether the memory device is operating properly.

For both read and write tests in the preferred embodiment, a new address indication signal is needed. The clock signals 6 and 7, which were originally indicating row and column addresses, are used by this embodiment in the modulated clock signal that serves as the CAS signal. An address indication signal notifies the memory device whether a separate address signal refers to a row address (X) or a column address (Y) or is not a valid address (Y). To generate an address indication signal in the preferred embodiment, clock signal 2 is combined with a multi-pulse signal. The clock 2 signal was originally designed to serve as the CAS signal. By combining the clock 2 and the multi-pulse signal, row addresses, column addresses, and invalid addresses are indicated to the memory device from the tester.

Figure 2:
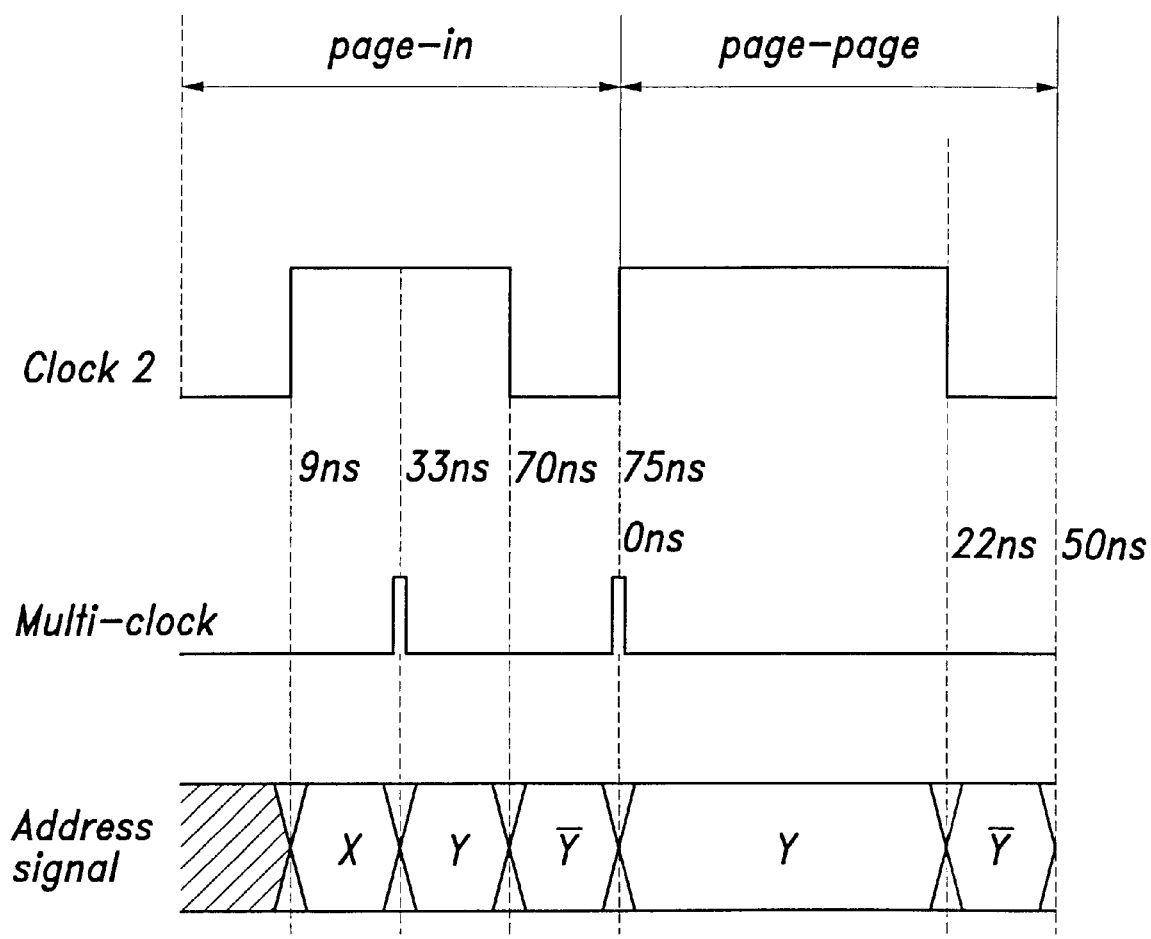
FIG. 2 is a timing diagram for EDO DRAM testing using modulated clock signals to produce an address indication signal according to the present invention.

FIG. 2 is a timing diagram that shows how an address indication signal is achieved by modulation of tester clock signals according to the preferred embodiment of the present invention. The multi-pulse signal is produced by the tester separately from the ten (10) general clock signals. When the clock 2 signal is high, an address in the address signal is considered valid; when the clock 2 signal is low, the address in the address signal is considered invalid. When the multi-pulse signal is at a high level, a column address (Y) starts on the address signal. When the multi-pulse signal is at a low level, the next valid address signal supplied to the memory device is considered to be a row address (X).

Figure 3:
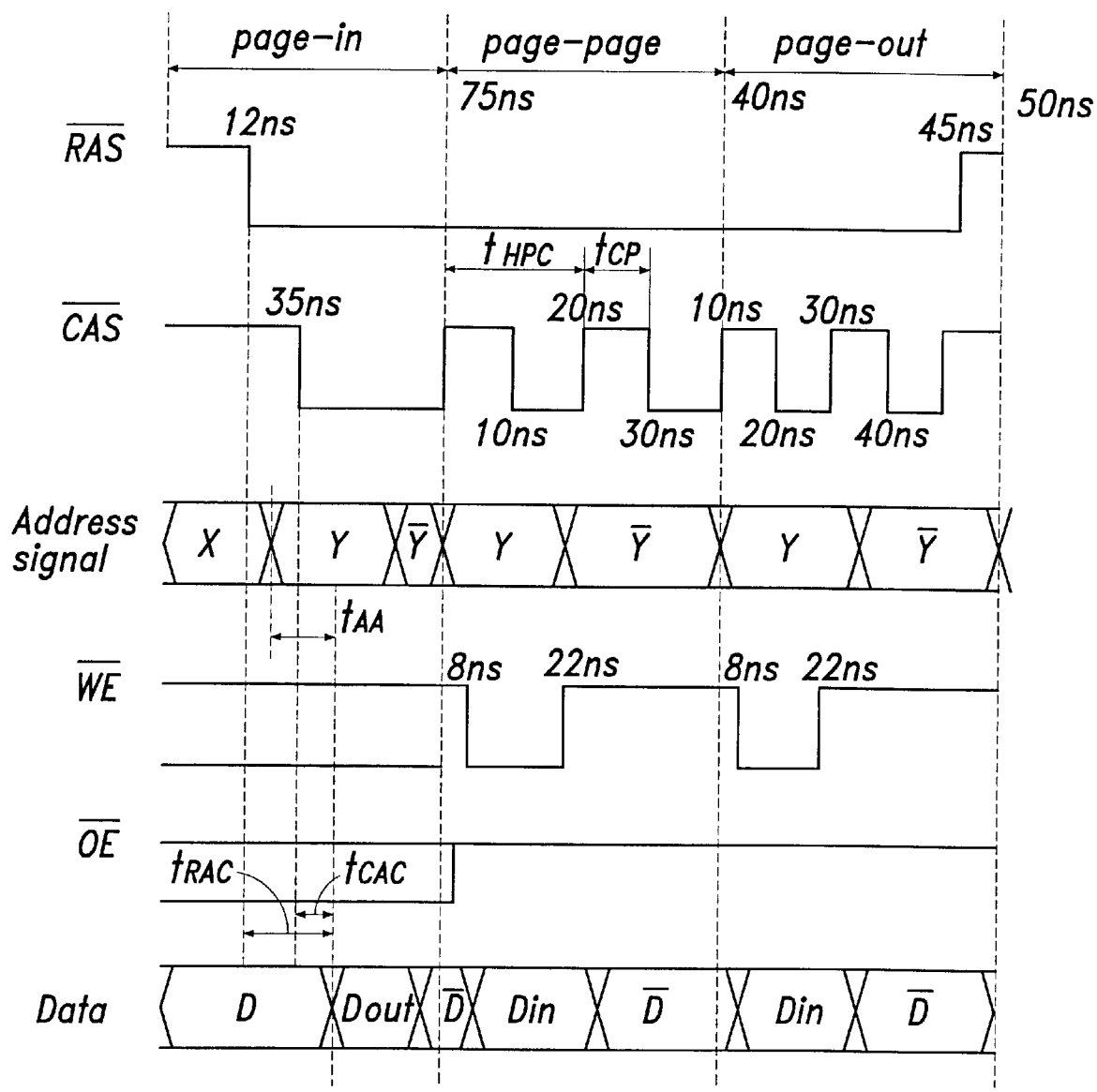
FIG. 3 is a timing diagram for EDO DRAM mixed mode test items according to the present invention.

As explained before, the EDO DRAM operates in a page defined by a row address. As shown in FIG. 3, a change in rows is a page operation composed of a page-in mode, a page-page mode, and a page-out mode. A new page operation begins with the page-in mode. The page-in mode begins with both the RAS signal and the CAS signals in the inactive high level, includes the transition of both signals to the active low level, and ends when the CAS signal next rises to the inactive level while the RAS signal remains in the active low level. The page-out mode occurs when both the RAS and CAS signals transition from their active low levels to their inactive high levels. The page-page mode occurs between the page-in and the page-out modes, and is defined by an RAS signal that remains in the active low level while the CAS signal toggles between the active low level and the inactive high level. The address format in the page-in mode is row address—column address (X-Y). The address format in the page-page mode and in the page-out mode is Y-Y, where Y denotes an invalid Y address.

Referring again to FIG. 2, by combining the multi-pulse signal and the clock 2 signal the required address format can be indicated. For example, the clock 2 signal is at a low level signifying an invalid address until 9 ns when it transitions to a high level signifying a valid address. At 9 ns, the multi-pulse signal is low indicating that a row (page) address, X, is starting. While the clock 2 signal remains at a high level, signifying a valid address, the multi-pulse transitions to a high level at 33 ns indicating the start of a column address, Y, and then the multi-pulse drops back to a low level. Thus in the page-in mode the address format becomes X-Y. In the page-page mode the multi-pulse transitions to a high level when the clock 2 signal transitions to a high level, for example at 0 ns of the page-page mode, thus indicating only a Y address is being supplied to the memory device. When the clock 2 signal transits back to a low level, the address becomes invalid, for example at 22 ns of the page-page mode in FIG. 2.

FIG. 3 is a timing diagram for EDO DRAM mixed mode test items, in which both read and write operations occur, according to one embodiment of the present invention. In FIG. 3, Y and D denote, respectively, an invalid address signal and an invalid data signal.

During the page-in mode RAS and CAS both transit to a low level, by definition. Not shown is the clock 2 signal, or the multi-pulse signal that transits to a high level at 33 ns of the page-in mode, which combine to indicate a row-column (X-Y) address format during the page-in mode; but, the effects of the clock 2 and multi-pulse signals are shown in the address signal depicted in FIG. 3. Because CAS is not toggled during the page-in mode, the modulation of clock signals 6 and 7 is not performed during the page-in mode. In this example, WE is at inactive high level and OE is at active low level, which causes valid data to be output from a memory cell addressed by the valid address signal. Three AC parameters specify the important timing parameters during the page-in mode of the mixed test. The time interval beginning at the transition of the RAS signal to the low level and ending with valid data in the I/O buffer is the Access time from RAS ($t_{RAC}$). The time interval beginning at the transition of the CAS signal to the low level and ending with valid data in the I/O buffer is the Access time from CAS ($t_{CAC}$). The time from a valid Y address to the valid data output is Access time from Y address ($t_{AA}$).

During the page-page mode, RAS remains at the active low level and CAS toggles. In order to obtain $t_{HPC}$=20 ns and $t_{CP}$=10 ns in the preferred embodiment, the modulation of clock signals 6 and 7 according to the present invention is performed to produce a CAS signal. In the preferred embodiment, the multi-pulse and clock 2 signals are modulated for indicating a column address (Y-Y) format. During the CAS precharge, the column address becomes valid and when the CAS transitions to active low level a valid column address Y is available for read or write. In the example embodiment depicted in FIG. 3, the WE signal is at the active low level and the OE signal is at an inactive high level, so the data in the data signal is written into the memory cell designated by the valid column address on the current page. After the column address hold time passes and CAS goes to the precharge state a second time, the column address becomes invalid. When the CAS signal again goes to the active low level there is not a valid column address and the data in the data signal are irrelevant as are the WE and OE signals. That is, the state of the data recognized at the second active CAS is invalid or "don't care."

In the page-out cycle, CAS also toggles, and therefore the modulation of clock signals 6 and 7 according to the preferred embodiment of the present invention is performed to produce a CAS signal with $t_{HPC}$=20 ns and $t_{CP}$=10 ns. According to the preferred embodiment, the multi-pulse and clock 2 signals are modulated for indicating a column address format (Y-Y).

Therefore, with the clock modulation of the preferred embodiment, it is possible to test an EDO memory device with a $t_{HPC}$=20 ns and a $t_{CP}$=10 ns by using a tester having a minimum test cycle time of 30 ns.

Table 1 shows the result of an experiment using a slow speed tester according to the present invention. In the experiment, a M9600 tester is used as the slow speed tester. The memory devices to be tested are chosen from a set of devices already found to be defective by using a high speed memory tester, i.e., a tester having a shorter minimum test cycle time than the operational cycle time of the memory device. In this experiment a X-9062 memory tester of ADVAN having the maximum frequency of 66 MHz (a minimum test cycle time of about 15 ns) was used as the high speed tester.

TABLE 1

| High Speed Memory Device Test Using Low Speed Tester | | | |
| --- | --- | --- | --- |
| M9600 Test Result | | | |
| Actual Failure | Speed Failure | $t_{RP}$ Margin Failure | EDO $t_{DOH}$ Failure |
| 74 | 20 | 46 | 8 |

The high speed tester found a total of 3,003 memory devices that failed. Among those failures, 74 failures occurred during EDO mode operations. In this experiment these 74 devices that actually failed were re-tested using the M9600 and the clock modulation methods of the present invention. The clock modulation methods of the present invention using the slow speed M9600 tester found that 20 devices suffered speed failure, 46 devices suffered $t_{RP}$ margin failure, and 8 devices suffered EDO $t_{DOH}$ failure. As a result, M9600 and the clock modulation methods of the present invention found all 74 devices with defective EDO operations.

A speed failure occurs when the device does not return correct data within the time associated with its claimed access speed, for example, when a device claiming 50 ns read access speed does not return correct data until a time longer than 50 ns. The parameter $t_{RP}$ is the RAS precharge time, the duration that the RAS signal is maintained at an inactive high level while a row address becomes valid. The $t_{RP}$ margin failure occurs when the data written or read are incorrect even though $t_{RP}$ is maintained at the inactive high level the correct amount of time. A $t_{DOH}$ failure occurs in the case where an invalid column address follows a valid column address on output, if valid data are not available in the I/O buffer for a sufficient time beginning at the transition of the following CAS signal to an active low level.

Accordingly, with the present invention, it is possible to overcome the maximum frequency limitation of a tester and to test high speed memory devices by using a low speed tester and a clock modulation technique.

While this invention has been described with reference to illustrative embodiments, various modifications in form and detail apparent to persons skilled in the art can be made without departing from the spirit and scope of the invention as defined by the appended claim and their equivalents.

What is claimed is:

1. A test method for testing a semiconductor device, the test method comprising:

provinding a tester which generates a plurality of general clock signals and which has a minimum test cycle time greater than an operational cycle time of the semiconductor device;

generating a modulated clock signal from a first general clock signal and a second general clock signal so that the modulated clock signal has a minimum cycle time no greater than the operational cycle time;

supplying the modulated clock signal to the semiconductor device as a predetermined control signal;

supplying test signals to the semiconductor device as specified by a functional test item; and comparing an output of the semiconductor device to a reference value.

2. The test method of claim 1, wherein the generating of a modulated clock signal comprises combining the first general clock signal and the second general clock signal using a NOR operation.

3. The test method of claim 1, wherein the modulated clock signal is supplied to the semiconductor device as a column address strobe (CAS) signal.

4. A test method for testing a semiconductor memory device having an extended data output (EDO) mode, said test method comprising:

providing a tester which generates a plurality of general clock signals and which has a minimum test cycle time greater than an EDO operational cycle time of the semiconductor memory device having an EDO mode;

generating a modulated clock signal from a first general clock signal and a second general clock signal so that the modulated clock signal has a minimum cycle time no greater than the EDO operational cycle time;

supplying the modulated clock signal to the semiconductor memory device as a column address strobe (CAS) signal;

supplying a third general clock signal to the semiconductor memory device as a row address strobe (RAS) signal;

supplying test signals to the semiconductor memory device as specified by each of a plurality of functional test items; and comparing an output of the semiconductor memory device to a reference value.

5. The test method of claim 4, wherein the generating of a modulated clock signal comprises combining the first general clock signal with the second general clock signal using a NOR operation.

6. The test method of claim 4, wherein during the supplying of test signals, the plurality of functional test items include an output data hold time, a hyper page cycle time, a CAS precharge time, and an access time from CAS precharge.

7. The test method of claim 4, wherein the semiconductor memory device operates in a page unit comprised of one page-in mode during which the RAS signal and the CAS signal each transit to an active state, a page-page mode during which the RAS signal remains at the active state while the CAS signal toggles between an inactive state and the active state, and one page-out mode during which the RAS signal and the CAS signal each transit to the inactive state.

8. The test method of claim 7, wherein the supplying of test signals further comprises:

supplying a fourth general clock signal to indicate a start of a valid memory cell address; and supplying a multi-pulse signal to indicate a start of a memory cell column address.

9. The test method of claim 8, wherein during the supplying of a fourth general clock signal and the supplying of a multi-pulse signal for the page-in mode, the fourth general clock signal and the multi-pulse signal indicate a row-column address format whereby a valid memory cell row address starts and is followed by a valid memory cell column address.

10. The test method of claim 8, wherein during the supplying of a fourth general clock signal and the supplying of a multi-pulse signal for the page-page mode and for the page-out mode, the fourth general clock signal and the multi-pulse signal indicate a column address format whereby only a valid memory cell column address starts.

11. The test method of claim 7, wherein during the supplying of test signals, the plurality of functional test items include an output data hold time, a hyper page cycle time, a CAS precharge time, and an access time from CAS precharge.

12. The test method of claim 11, wherein the supplying of test signals further comprises:

supplying an output enable (OE) signal to control a read operation of the semiconductor memory device; and supplying a write enable (WE) signal to control a write operation of the semiconductor memory device.

13. The test method of claim 12, wherein the comparing comprises checking the reference value against a valid data output produced by the read operation when the CAS signal is in the active state for a first time in the page-page mode.

* * * * *